(12) United States Patent
Wongsenakhum et al.

(10) Patent No.: US 8,262,800 B1
(45) Date of Patent: Sep. 11, 2012

(54) METHODS AND APPARATUS FOR CLEANING DEPOSITION REACTORS

(75) Inventors: Panya Wongsenakhum, San Francisco, CA (US); Abhishek Manohar, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 763 days.

(21) Appl. No.: 12/030,145

(22) Filed: Feb. 12, 2008

(51) Int. Cl.
*B08B 7/00* (2006.01)

(52) U.S. Cl. .......................................... 134/1.1

(58) Field of Classification Search .................. None
See application file for complete search history.

(56) References Cited

U.S. PATENT DOCUMENTS

| | | | |
|---|---|---|---|
| 4,787,957 A | 11/1988 | Barkanic et al. | |
| 5,160,402 A | 11/1992 | Cheng | |
| 5,326,723 A * | 7/1994 | Petro et al. | 438/685 |
| 5,413,670 A | 5/1995 | Langan et al. | |
| 5,454,903 A | 10/1995 | Redeker et al. | |
| 5,788,778 A | 8/1998 | Shang | |
| 5,846,373 A | 12/1998 | Pirkle et al. | |
| 5,888,337 A | 3/1999 | Saito | |
| 5,986,747 A | 11/1999 | Moran | |
| 6,060,397 A | 5/2000 | Seamons et al. | |
| 6,067,999 A * | 5/2000 | Hines et al. | 134/1.1 |
| 6,124,927 A | 9/2000 | Zhong et al. | |
| 6,274,058 B1 * | 8/2001 | Rajagopalan et al. | 216/67 |
| 6,305,390 B1 | 10/2001 | Jeon | |
| 6,492,186 B1 | 12/2002 | Han et al. | |
| 6,534,007 B1 | 3/2003 | Blonigan et al. | |
| 6,547,458 B1 | 4/2003 | Janos et al. | |
| 6,569,257 B1 | 5/2003 | Nguyen et al. | |
| 6,716,765 B1 | 4/2004 | Hanprasopwattana et al. | |
| 6,767,836 B2 | 7/2004 | San et al. | |
| 7,479,191 B1 | 1/2009 | Entley et al. | |
| 2001/0050143 A1 * | 12/2001 | Crocker | 156/345 |
| 2004/0045577 A1 * | 3/2004 | Ji et al. | 134/1.1 |
| 2004/0144400 A1 * | 7/2004 | Satoh et al. | 134/1.1 |
| 2004/0261815 A1 | 12/2004 | Pavone | |
| 2005/0082001 A1 | 4/2005 | Sugiura | |
| 2005/0161060 A1 | 7/2005 | Johnson et al. | |

(Continued)

FOREIGN PATENT DOCUMENTS

WO  2007-097822  8/2007

OTHER PUBLICATIONS

U.S. Appl. No. 11/112,741, "Method for endpointing CVD chamber cleans following ultra low-K film treatments", Entley et al., filed Apr. 22, 2005.

(Continued)

*Primary Examiner* — Michael Kornakov
*Assistant Examiner* — Nicole Blan
(74) *Attorney, Agent, or Firm* — Weaver Austin Villeneuve & Sampson LLP (57) ABSTRACT

Improved methods of removing tungsten film from the interior reactor and reactor component surfaces between tungsten deposition operations are provided. The methods involve increasing the availability of molecular fluorine to remove tungsten from the reactor while maintaining fast removal rates. Certain embodiments involve a multi-stage process including a stage in which atomic fluorine is introduced at a low pressure (e.g., about 8 Torr or less) and a stage in which molecular fluorine is introduced or allowed to form in the chamber at high pressure (e.g., about 8 Torr or higher).

23 Claims, 10 Drawing Sheets

U.S. PATENT DOCUMENTS

| | | | |
|---|---|---|---|
| 2006/0027249 A1 | 2/2006 | Johnson et al. | |
| 2006/0054183 A1* | 3/2006 | Nowak et al. | 134/1.1 |
| 2006/0124151 A1* | 6/2006 | Yamasaki et al. | 134/1.1 |
| 2006/0157448 A1 | 7/2006 | Magni et al. | |
| 2007/0006893 A1* | 1/2007 | Ji | 134/1.1 |

OTHER PUBLICATIONS

U.S. Appl. No. 11/112,741, Office Action mailed Jul. 31, 2008.

U.S. Appl. No. 11/112,741, Notice of Allowance mailed Nov. 14, 2008.

U.S. Appl. No. 11/112,741, Allowed Claims.

Entley et al., "Optimizing utilization efficiencies in electronegative discharges: the importance of the impedance phase angle", Journal of Applied Physics, vol. 86, No. 9, Nov. 1, 1999, pp. 4825-4835.

Vitale, et al. "Etching chemistry of benzocyclobutene (BCB) low-κdielectric films in $F_2+O_2$ and $Cl_{2+O_2}$ high density plasmas", J. Vac. Sci. Technol. A, vol. 18, No. 6, Nov./Dec. 2000, pp. 2770-2778.

U.S. Appl. No. 11/112,742, "CVD chamber cleans following ultra low-K treatments", Entley et al., filed Apr. 22, 2005.

U.S. Appl. No. 11/112,742, Office Action mailed May 15, 2007.

U.S. Appl. No. 11/112,742, Office Action mailed Oct. 2, 2007.

U.S. Appl. No. 12/355,601, "Plasma clean method for deposition chamber", Fang et al., filed Jan. 16, 2009.

U.S. Appl. No. 12/355,601, Office Action mailed Sep. 9, 2010.

U.S. Appl. No. 12/355,601, Office Action mailed Apr. 18, 2011.

* cited by examiner

METHODS AND APPARATUS FOR CLEANING DEPOSITION REACTORS

FIELD OF THE INVENTION

This invention relates to technology for cleaning deposition reactors. More particularly, it relates to removing unwanted film such as tungsten film, deposited during deposition processes from deposition reactors.

BACKGROUND OF THE INVENTION

Tungsten films are deposited at various stages of integrated circuit fabrication. For example, tungsten films are widely used to interconnect metallization layers. Tungsten may be deposited by various processes, including chemical vapor deposition (CVD) and physical vapor deposition (PVD) processes. One consequence of these processes is that tungsten is deposited on exposed heated interior surfaces in the reaction chamber as well as on the partially fabricated integrated circuit. To maintain fully operational equipment, high throughput and prevent particulate contamination, the accumulated tungsten film should be cleaned from the reactor surfaces. Conventional methods of cleaning the reactor, which use atomic fluorine (F) to remove accumulated tungsten from tungsten deposition reactors at a pressure regime of less than 8 Torr, result in over-etch of a certain parts of the reactor. The result of over-etch is lower life expectancy for these reactor components, as well as generation of contaminating particles. The difficulties with conventional cleaning processes also affect cleaning of other types of films as well.

SUMMARY OF THE INVENTION

The present invention provides improved methods of removing tungsten film from the interior reactor and reactor component surfaces between tungsten deposition operations. The methods involve increasing the availability of molecular fluorine to remove tungsten from the reactor while maintaining fast removal rates. Certain embodiments involve a multi-stage process including a stage in which atomic fluorine is introduced at a low pressure (e.g., about 8 Torr or less) and a stage in which molecular fluorine is introduced and/or allowed to form in the chamber at high pressure (e.g., about 8 Torr or higher). Certain embodiments of the invention may be used to clean other types of film, including photoresist.

These and other aspects and advantages of the invention are described further below and with reference to the drawings.

DETAILED DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention. For the sake of discussion, much of the below description refers to tungsten films. However, given the description herein, one of skill in the art will understand how to implement the methods of the invention to remove other types of film from deposition chambers. In addition etchants other than fluorine, including oxygen and hydrogen, may be used in the methods of the invention.

INTRODUCTION

Figure 1A:
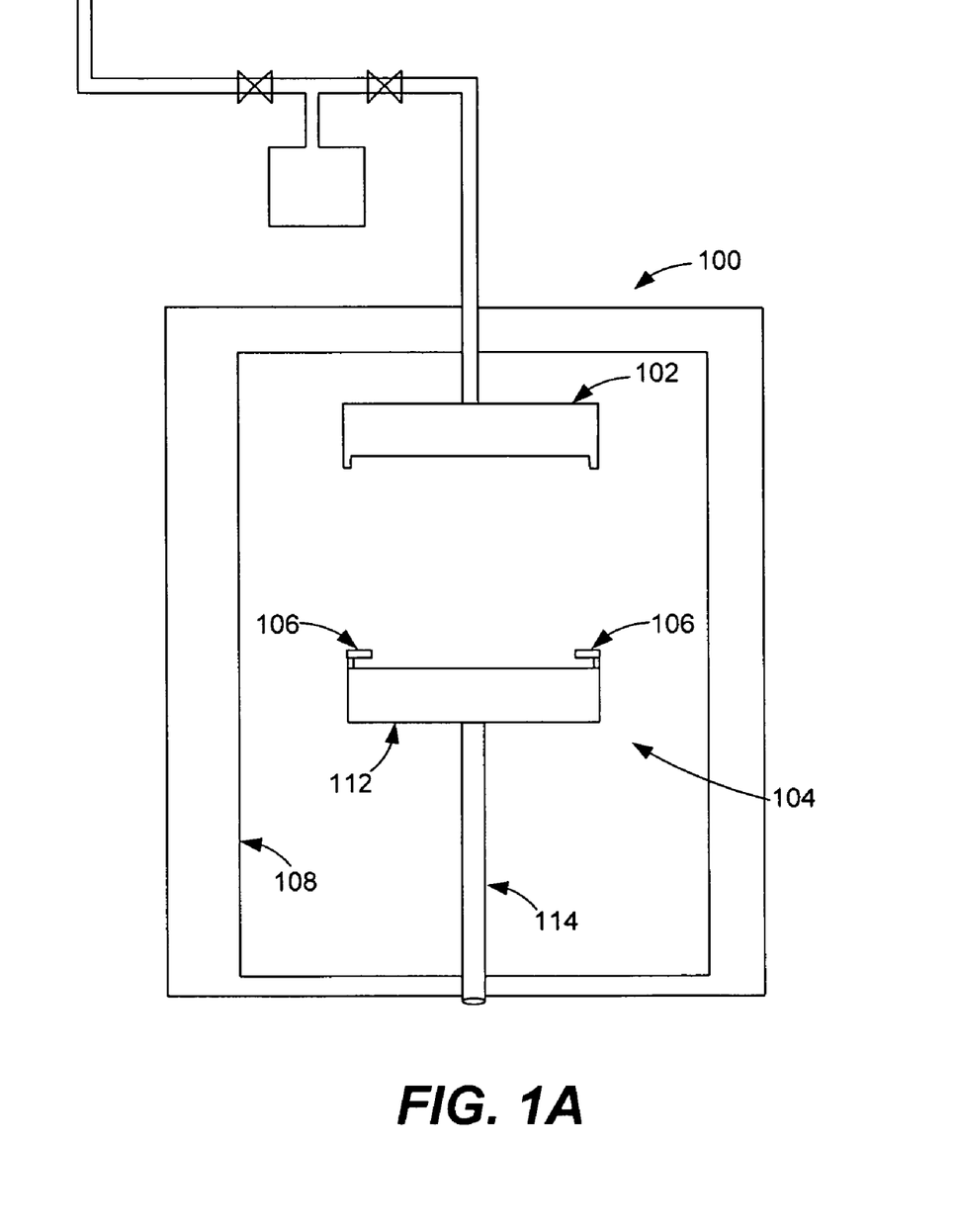
FIG. 1a is a schematic of a tungsten deposition chamber.

A schematic illustration of a tungsten deposition reactor is shown in FIG. 1a. Reactor 100 contains pedestal 104, which is configured to support a semiconductor wafer or other substrate on which tungsten is to be deposited. Showerhead 102, or other gas inlet, is used to distribute reactant gases in the chamber during deposition. Pedestal 104 supports the wafer during the deposition process. A ring 106 on pedestal 104 may be used to position the wafer for deposition and/or be placed over the wafer as an exclusion ring to prevent deposition on the edge of the wafer. The pedestal 104 may be made of a material such as aluminum. Carrier/exclusion ring 106 is typically made of ceramic. In the figure ring 106 is shown resting on pins 107, though other configurations or arrangements may also be employed.

Figure 1B:
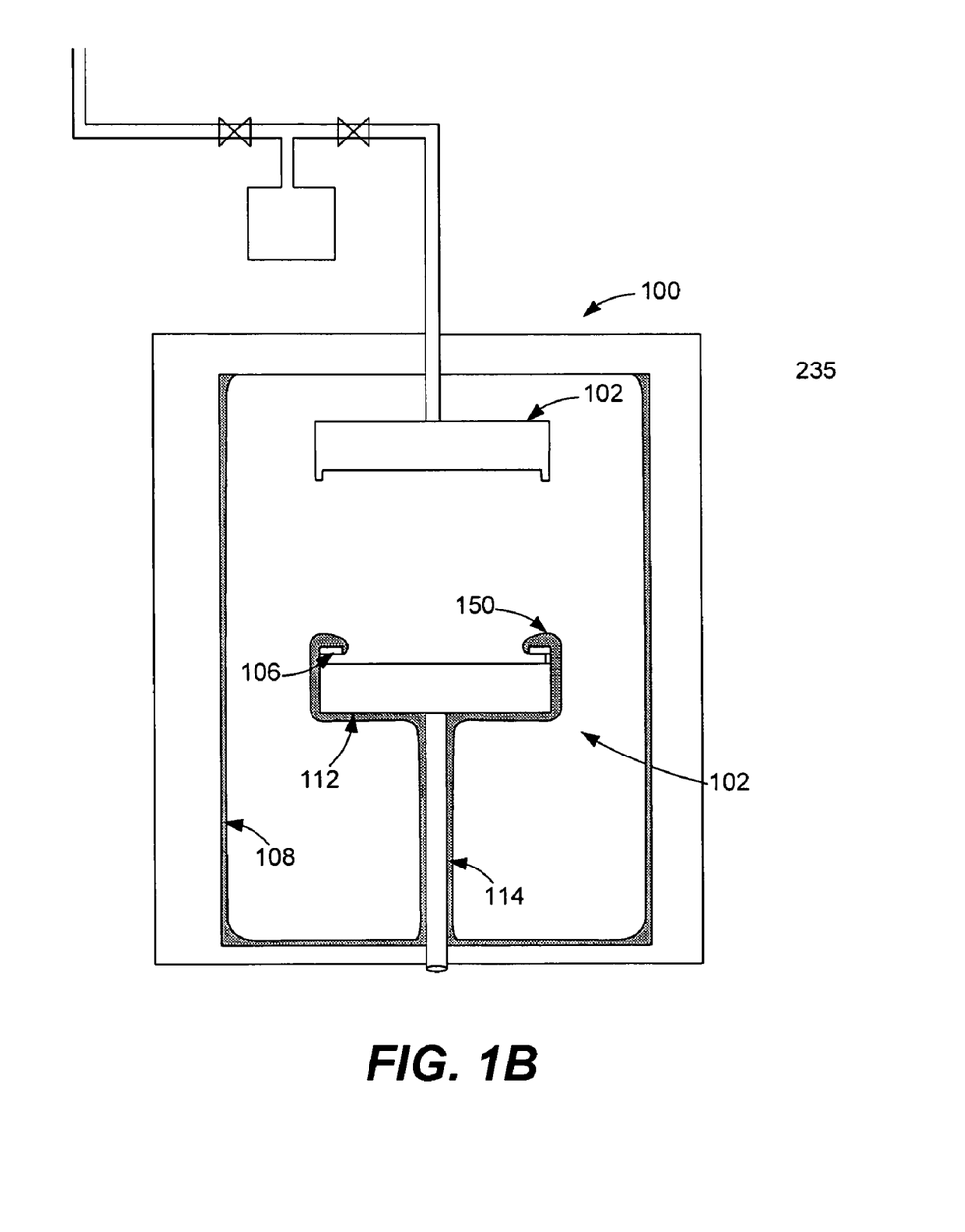
FIG. 1b is a schematic of a tungsten deposition chamber having tungsten film deposited on reactor and reactor components surfaces.

During a deposition process, e.g., a CVD tungsten deposition process, reactant gases are introduced through showerhead 102. The reactant gases react to deposit a tungsten film on the wafer surface. For example, tungsten hexafluoride $WF_6$ and a reducing agent such as silane $SiH_4$ or hydrogen $H_2$ are introduced to react and form tungsten. The deposited tungsten film may contain some impurities. In addition to being deposited on the wafer surface, however, tungsten film may form on any surface exposed to the reactant gases, including the interior surfaces 108 of the chamber housing, the underside 112 and support 114 of the pedestal and on carrier or exclusion ring 106. Unwanted tungsten deposition on reactor components is not limited to CVD processes, but also occurs during other types of deposition processes, including atomic layer deposition (ALD), pulsed nucleation layer (PNL) and PVD processes. FIG. 1b shows a representation of a reactor after a wafer has been transferred out following a tungsten deposition process. Tungsten film 150 is present on various reactor components, including chamber surface 108, carrier/exclusion ring 106 and the underside 112 of the pedestal.

Atomic fluorine is conventionally used for removing accumulated tungsten from the tungsten deposition reactor. Atomic fluorine is typically generated in a remote plasma generator, then introduced to the reactor at a pressure of less than 5 Torr. Pressure is inversely related to etch rate of atomic fluorine: the lower the pressure, the higher the etch rate. Pressure in conventional atomic fluorine based cleaning methods is generally as low as tolerable without damaging the ceramic parts such as the carrier or exclusion ring. (The exothermic reaction of fluorine and tungsten on the ceramic ring limits the minimum pressure and maximum flowrate that can be used—otherwise breakage from thermal stress can occur). For example, in one conventional process, a 3 Torr stage is used to remove tungsten film from the top of the pedestal and carrier ring, followed by an aggressive stage at 1 Torr designed to clean the bottom and side of the pedestal. These operating conditions, however, result in large differences in etch rate on different areas of the reactor.

Figure 2:
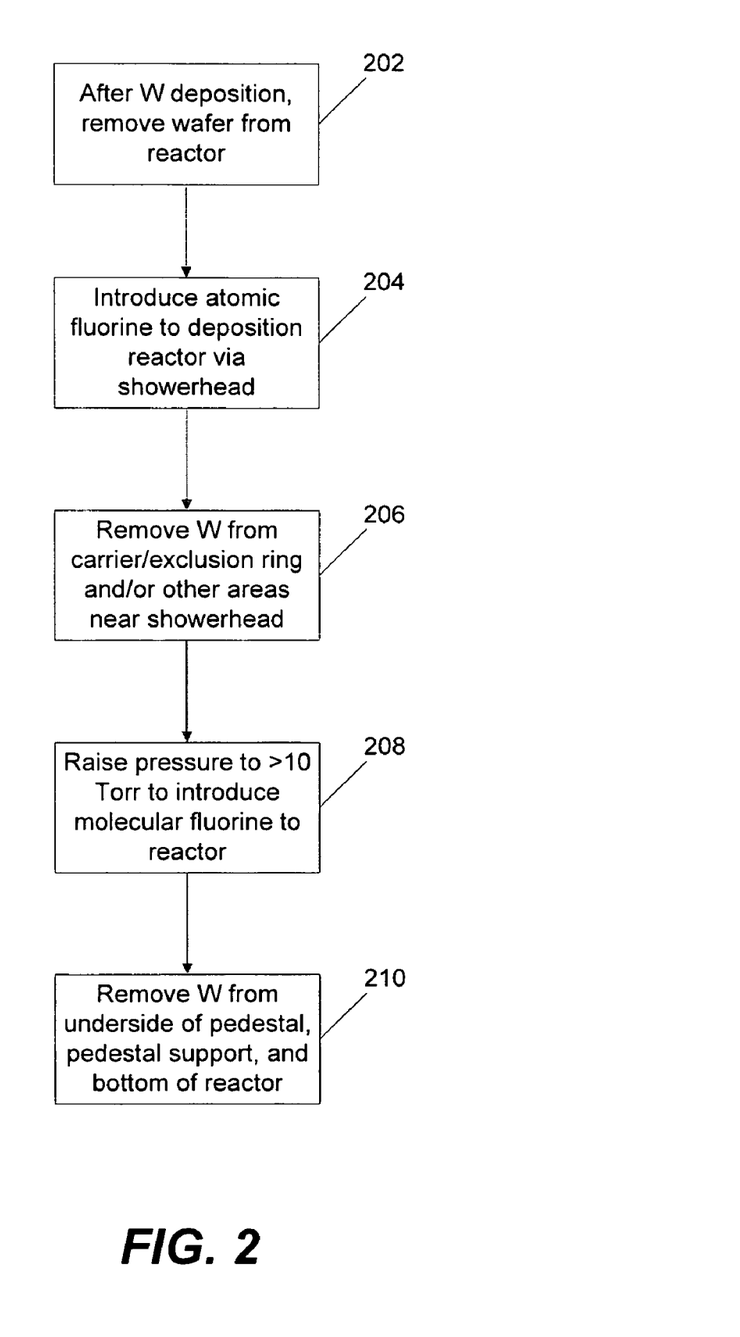
FIG. 2 is a flow chart illustrating operations in a multi-stage process of removing tungsten from deposition chamber surfaces.

Embodiments of the present invention involve multi-stage cleaning processes that include a low pressure (less than or equal to about 5 Torr) stage and a high pressure (greater than or about equal to 10 Torr) stage. The methods provide improved clean uniformity, reduced damaged to ceramic parts and increased throughput. FIG. 2 is a process flow sheet showing operations in a method of cleaning a tungsten deposition reactor according to certain embodiments. First, in an operation 202, a wafer is removed from a deposition chamber. Next, in an operation 204, atomic fluorine is introduced to the chamber at low pressure, below or equal to about 5 Torr, and in certain embodiments, below or equal to about 3 Torr. Tungsten film is thereby removed—primarily from the top of the pedestal and the carrier or exclusion ring in an operation 204. This operation may be performed until the some, a significant portion, or substantially all the tungsten is removed from the ceramic ring, for example, as indicated by visual inspection through a window. After the desired amount of the tungsten is removed from the ceramic ring and top of the pedestal, pressure is raised in the reaction chamber to at least about 10 Torr in an operation 206. This has the effect of recombining the atomic fluorine species at the showerhead to generate molecular fluorine. The molecular fluorine is used to etch the side and/or underside of the pedestal. This operation may be continued until substantially all tungsten is removed from the reactor, or the amount tungsten is at an acceptably low level.

Figure 3:
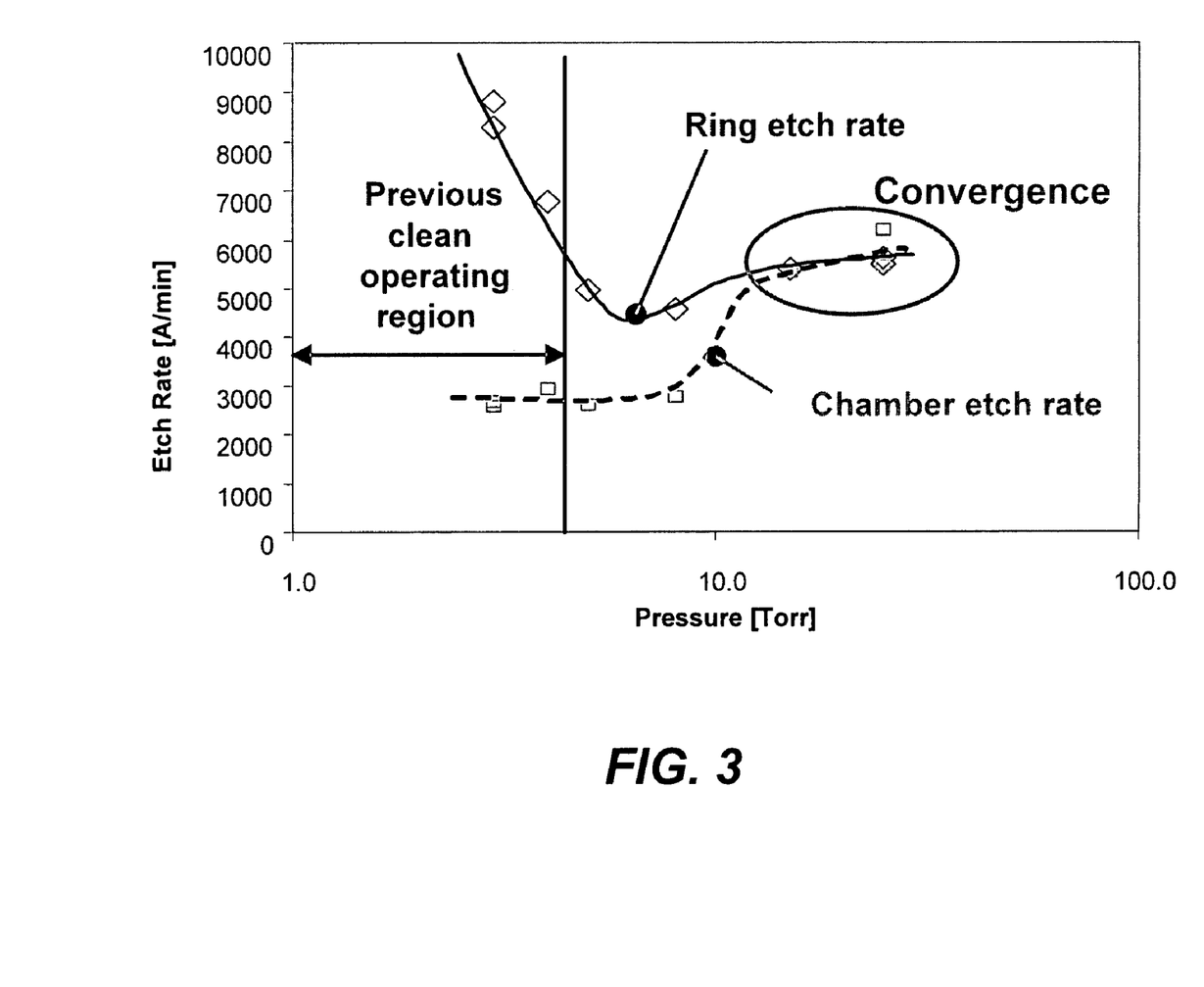
FIG. 3 is a plot of 1) the etch rate of tungsten etched from an exclusion ring and 2) overall chamber etch rate versus pressure.

The process described above with reference to FIG. 2 is based on the unexpected finding that aggressive atomic fluorine cleans as conventionally used to clean the side of and below the pedestal (as well as other hard to reach or further from the showerhead locations in the reactor) do not improve tungsten removal rates from these areas. FIG. 3 is a plot showing chamber and ceramic carrier ring etch rates as a function of pressure. Carrier ring etch rate is measured by visually inspecting the carrier ring with etch rate calculated from the time taken to clean the ring. Chamber etch rate is measured by measuring the amount of tungsten hexaflouride in the chamber, with etch rate calculated from the time taken to remove all of the tungsten from the reactor.

At lower clean pressures, atomic fluorine generated does not recombine at a fast rate. More atomic fluorine is available at the top of the pedestals and the rings. As expected, carrier ring etch rate increases sharply with decreasing pressure. The chamber etch rate, however, is low and unexpectedly does not increase with decreasing pressure. Prior to the inventors' work, it was expected that the aggressive stage at 1 Torr designed to clean the bottom and side of the pedestal would permit the atomic flourine to reach and clean the bottom of the chamber and underside of the pedestal, and so the chamber etch rate would similarly increase with decreasing pressure. However, as shown in FIG. 3, chamber etch rate remains fairly constant through the low pressure regime. It is believed that this is because, even at very low pressures of 1 Torr, the atomic flourine is unable to reach the bottom of the chamber but recombines into molecular flourine. In the high pressure regime used in the methods described herein, both ring etch rate and chamber etch rate show an increase as chamber pressure increases: the carrier ring etch rate has a minimum at about 5 Torr above which it increases gradually. The chamber etch rate increases around 10 Torr and continues to increase with increasing pressure.

FIG. 3 illustrates that there are two distinct pressure regimes that provide advantageous results for cleaning different parts of the reactor: a low pressure regime that cleans the carrier ring and a high pressure regime that cleans the entire chamber. Moreover, at pressures above 10 Torr, there is low availability of atomic fluorine at the top of the pedestal, which reduces overetch of the carrier ring. In certain embodiments, the methods are performed without the low pressure stage. FIG. 3 shows that at a certain pressure regime, the carrier ring and chamber etch rates converge. In certain embodiments, the high pressure stage is operated in this range, thereby removing about the same amount of tungsten from the chamber walls, pedestal and carrier ring. In operations in which the amount of deposition on the carrier ring is approximately the same as the average amount deposited on the chamber walls, for example, one or more high pressure stages may be run without using a low pressure stage. In certain embodiments, total clean time is minimized by operating in the low pressure regime to quickly remove tungsten from the carrier ring and top of the reactor. These areas are closer to the showerhead and so often see greater tungsten deposition. As described above with respect to FIG. 2, a multi-stage clean operation may be used with a low pressure stage prior to a high pressure stage. In other embodiments, a high pressure stage may be performed prior to the low pressure stage. For example, in a particular embodiment, a first step is at 15 Torr and a second step at 1 Torr. The first step cleans tungsten from all parts of the reactor and carrier ring, and the second step aggressively cleans tungsten from the carrier ring (as well as upper parts of the pedestal and reactor in certain embodiments.)

Figure 4:
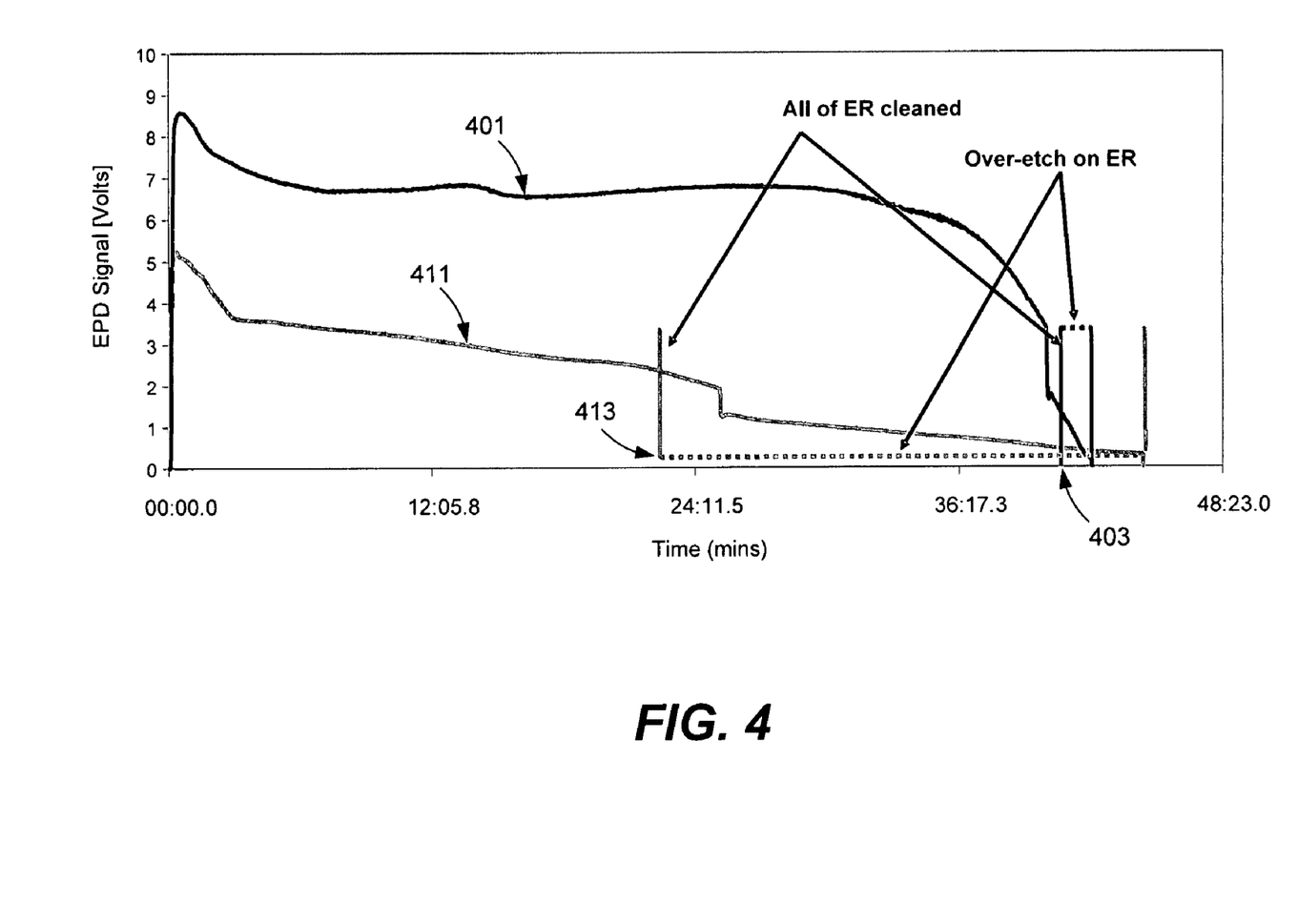
FIG. 4 is a plot of EPD signal (corresponding to the amount of tungsten hexafluoride in the reactor) versus time for a conventional process and a process according to an embodiment of the invention.

As indicated above, a major problem with conventional tungsten clean processes is the damage to chamber parts, especially ceramic carrier/exclusion rings, caused by over-etch. Over-etch results from having different etch rates and thicknesses of deposition at different parts of a reactor: operating in a low pressure regime (as shown in FIG. 3) results in a high etch rate for the carrier ring and low etch rate for the chamber as a whole. This is due to the carrier ring being in the direct line of sight and in close proximity to the showerhead or other gas inlet. Enough tungsten is removed to expose some of the reactor components to the etchant, with the resulting degradation of the part. Carrier/exclusion rings are particularly susceptible as they are often made of ceramic, while most other tungsten reactor components are aluminum. FIG. 4 is a plot of EPD signal (corresponding to the amount of tungsten hexafluoride in the reactor) versus time for a conventional process and a process according to an embodiment of the invention. Curve 411 shows the amount of tungsten hexafluoride for a conventional process, which used a two stage low pressure regime clean (3 Torr/1 Torr); curve 401 shows the amount of tungsten hexafluoride for a high pressure/low pressure two-stage clean (15 Torr/1 Torr). The time at which the conventional process has cleaned the tungsten from the exclusion ring (ER) is indicated at 413; the time at which the multi-stage process of the invention has cleaned the tungsten from the ER is indicated at 403. Over-etch of the ER occurs for remainder of the clean time. As can be seen from the figure, the conventional process results in over-etch of the ER for more than 20 minutes (from about 22 minutes to about 45 minutes); the process according to an embodiment of the invention results in over-etch of the ER for only a few minutes. The process according to an embodiment of the invention also results in a slight reduction in total clean time.

Figure 5A:
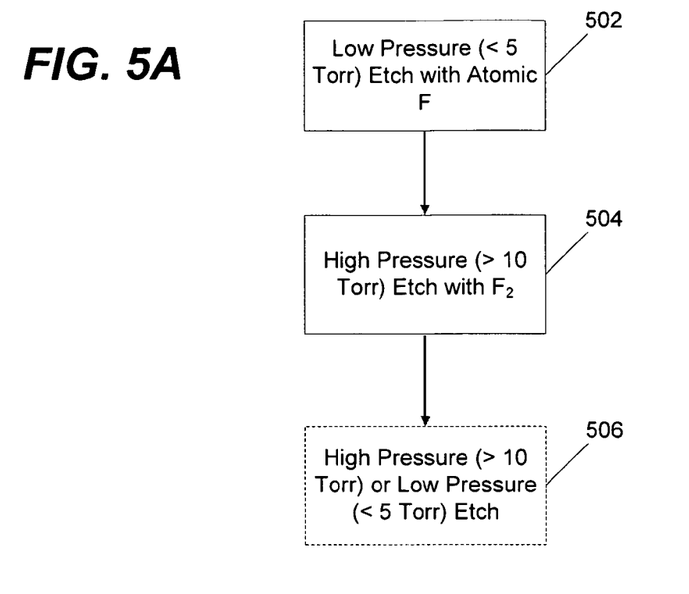
FIGS. 5a and 5b are flow charts illustrating operations in multi-stage processes of removing tungsten from a deposition chamber according to embodiments of the invention.
Figure 5B:
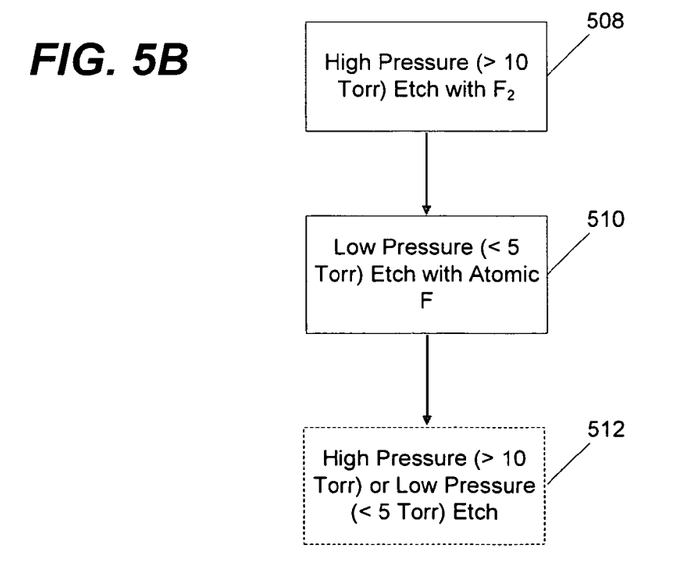
Figure 6A:
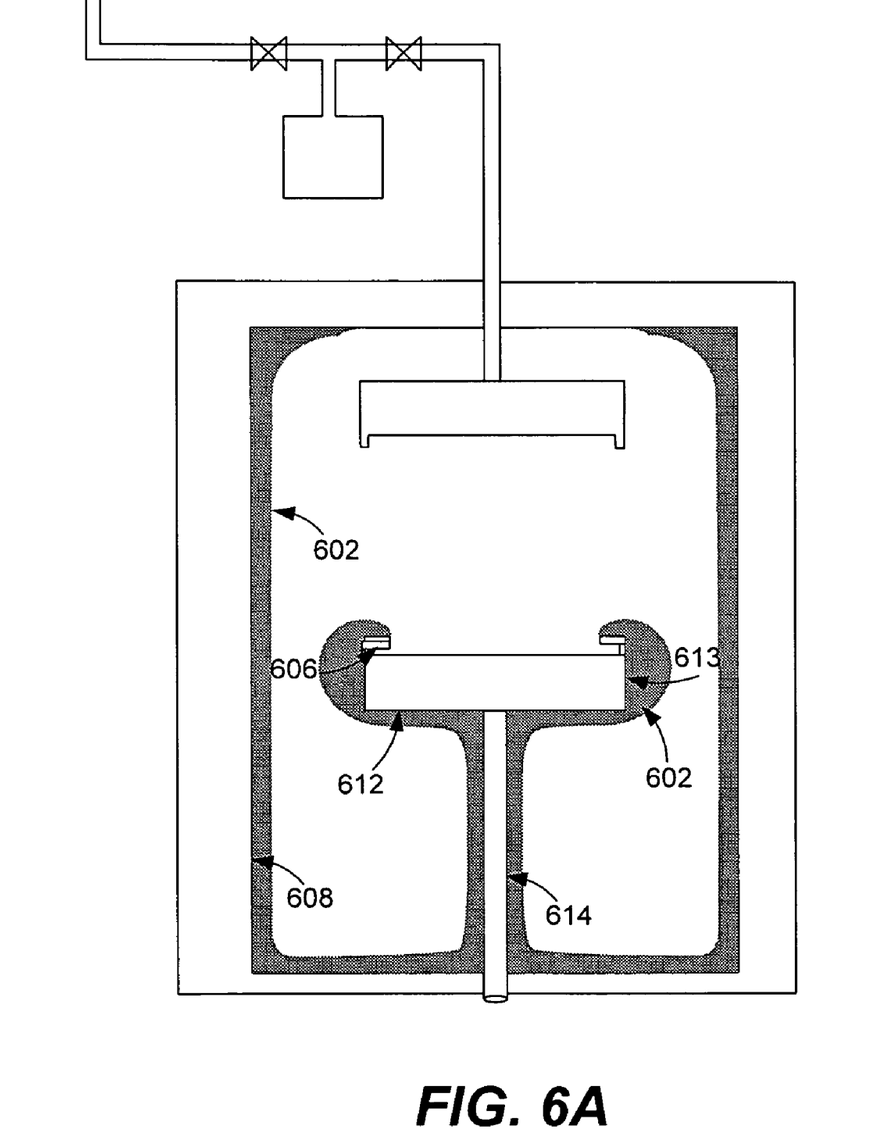
FIGS. 6a-6c are schematic illustrations of a tungsten deposition chamber during various stages of a cleaning process.
Figure 6B:
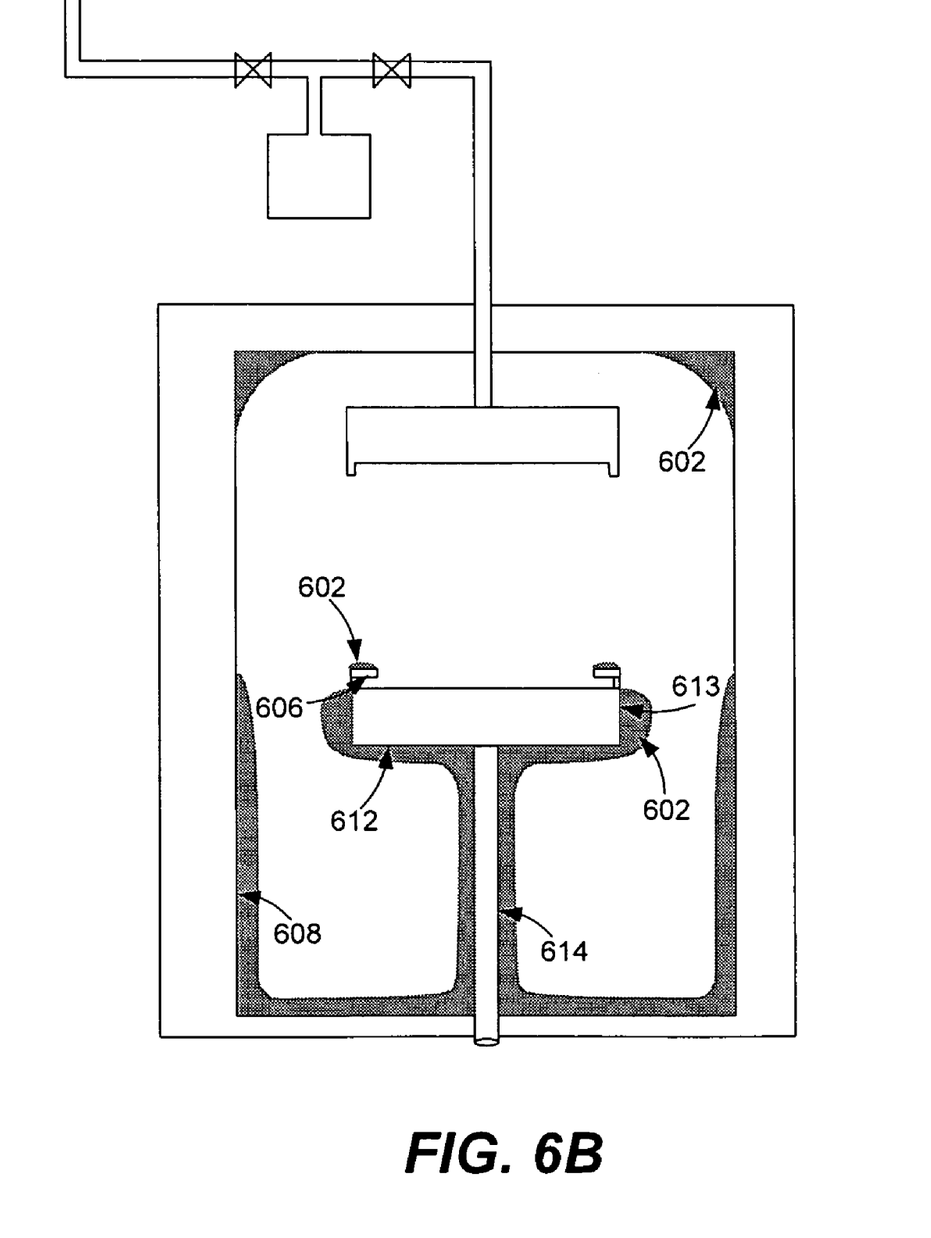
Figure 6C:
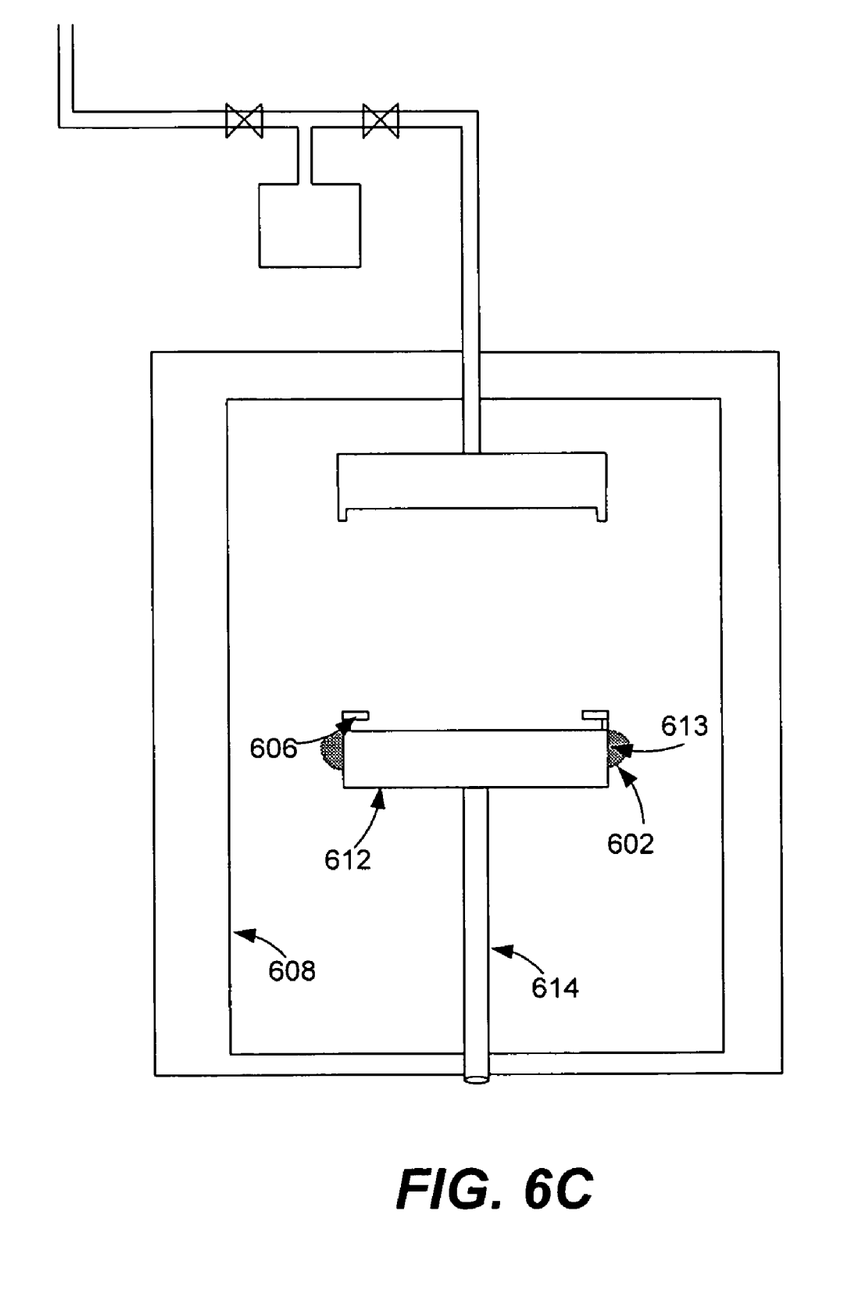

Use of a high pressure stage results in less over-etch, thereby prolonging reactor component life. In embodiments in which a multi-stage low pressure and high pressure stages are used, there may be more than one low pressure stage and/or more than one high pressure stage to clean the chamber. Examples of various process flows are shown in FIGS. 5a and 5b. FIG. 5a shows a low pressure etch with atomic fluorine in operation 502, followed by a high pressure etch with molecular fluorine in operation 504. An example of this process flow is shown in FIG. 2, discussed above. During the low pressure etch, which occurs at about or less than 5 Torr, and more particularly at or about less than 3 Torr, fluorine atoms introduced to the reactor via a showerhead are able to reach the tungsten film deposited near the showerhead without recombining, and so can remove the film at high etch rates (as shown above in FIG. 3). The lower the pressure at this stage, the higher the etch rate. (Some of the tungsten film removed during the low pressure operation may be removed by recombined fluorine gas.) During the high pressure etch, molecular fluorine is introduced to the reactor, and etches film from the areas and components of the reactor that geometry constraints prevent atomic fluorine from reaching during the low pressure stage. Tungsten film remaining on the carrier/exclusion ring and the upper parts of the reactor continues to be etched by the molecular fluorine as well. An optional third stage, either a low pressure or a high pressure stage is shown at 506. FIG. 5b shows a high pressure stage at operation 508, followed by a low pressure stage 510. An optional third stage is shown at 512. FIGS. 6a-6c show an example of a situation where it may be useful to have a three stage process as depicted in FIGS. 5a and 5b. First, in FIG. 6a, prior to any cleaning, tungsten film 602 is shown deposited on reactor surfaces and various reactor components, including chamber walls 608, the support 614, side 613 and underside 612 of the pedestal, and the exclusion ring 606. The tungsten film shown in FIG. 6a has been deposited unevenly over these surfaces, with thicker films on the pedestal side 613 than on the underside 612, for example. Non-uniformity in deposition may be the result of chamber geometry, plasma concentration, and other deposition conditions, for example. FIG. 6b shows the film remaining after a low pressure etch. The upper portion of walls 608 have been cleaned, with the exception of film 602 in the upper corners of the reactor. The amount of tungsten film 602 on the exclusion ring 606 and side 613 of the pedestal has been substantially reduced, though with some film remaining on both. Most of the tungsten film 602 deposited on the lower portion of the reactor walls 608 and on pedestal support 614 and underside 612, is still present however. This is due to recombination of the atomic species, even at low pressure (around 1 Torr) prior to reaching these areas, into molecular fluorine. FIG. 6c shows the film remaining after a high pressure stage. Almost all of the tungsten 602 has been removed, with the exception of a small amount on the side 613 of the pedestal. At this point, a brief low pressure operation may be used to quickly remove the remaining tungsten. Similarly, high and low pressure operations may be performed in any sequence to optimize the clean as appropriate for the particular chamber geometry by minimizing total clean time and over-etch.

In processes that employ more than two stages, the additional stages may be performed at the same or different pressures than earlier stages. For example, in a process that employs two low pressure stages, one stage may have a pressure of 1 Torr and the other a pressure of 3 Torr, or the stages may be performed at the same pressure.

Apparatus

Any suitable deposition chamber may be cleaned using the methods of the invention. Examples of deposition apparatuses that may be cleaned using the methods described herein include Novellus Concept 2 Altus, a Concept-2 Altus-S, a Concept 3 Altus deposition systems, all available from Novellus Systems, Inc. of San Jose, Calif., or any of a variety of other commercially available CVD processing systems. In some cases, depositions performed on multiple deposition stations sequentially. Each station may be cleaned by the methods described above.

Figure 7:
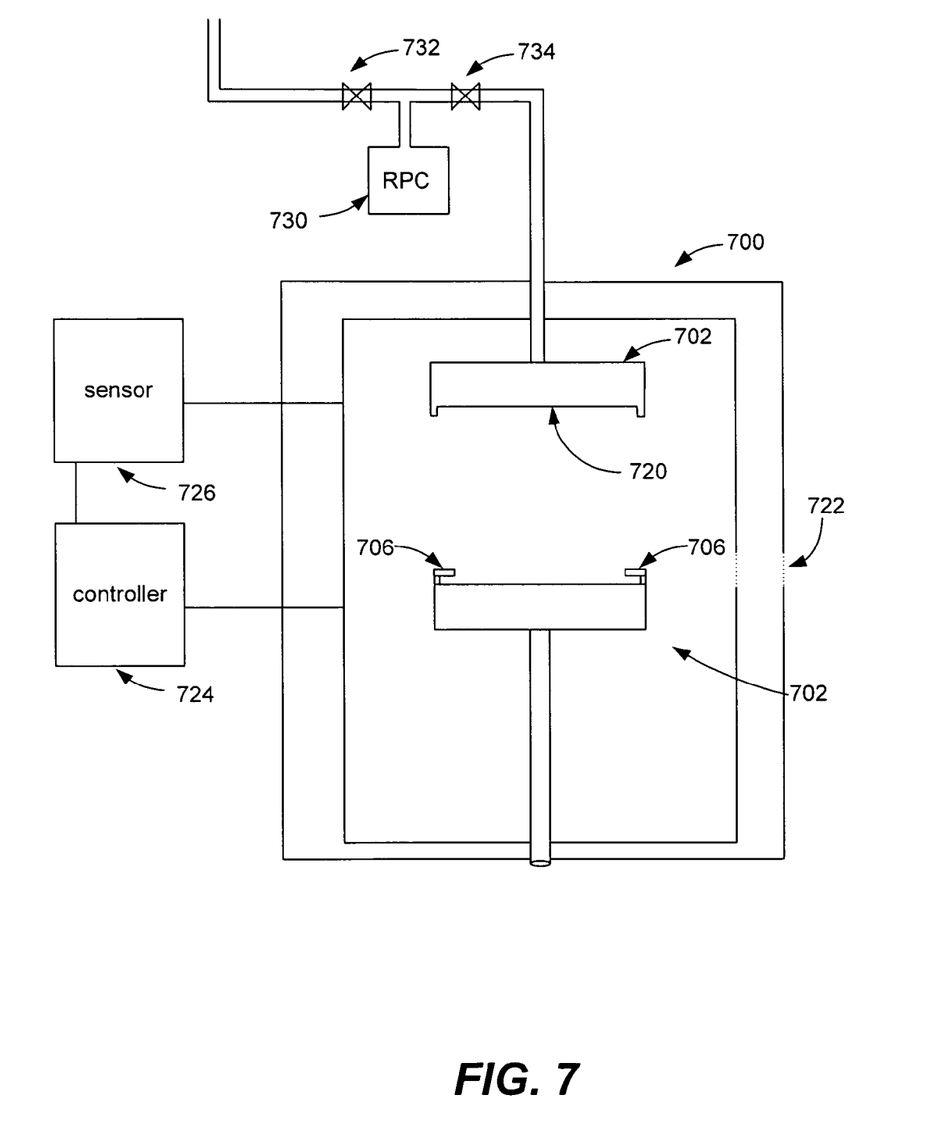
FIG. 7 is a schematic of an apparatus that may be used in accordance with the methods of the invention.

FIG. 7 shows an apparatus that may be used in accordance with the methods of the invention. As indicated above, the deposition reactor 700 to be cleaned typically has a pedestal 702 that supports a wafer during the deposition. Exclusion ring 706, which is typically made of ceramic, covers the edge of a wafer and is used to prevent deposition on the edge. A carrier ring to facilitate transport may also be present.

The methods of the invention involve introducing molecular fluorine, and in certain embodiments, atomic fluorine into the reactor 700. Atomic fluorine is generated in a remote plasma chamber 730. In operation, a fluorine-containing gas, e.g., $NF_3$, is introduced to the remote plasma chamber 730 via a valve 732. Atomic fluorine is generated therein. Valve 734 is opened to allow the atomic species to enter the chamber via the showerhead 702. FIG. 7 shows just one example of a remote plasma chamber; other arrangements and configurations may be used. During the low pressure stage, the atomic species enter the chamber and etch the tungsten film (not shown) deposited on the reactor components as discussed above. To introduce molecular fluorine into the reactor, the pressure is raised as described above. At high enough pressures, e.g., greater than about 8 Torr, or in certain embodiments, greater than about 5 Torr, the fluorine atoms recombine in the showerhead and inlet tube and/or near the surface of the showerhead outlet 720 and create molecular fluorine. (One of skill in the art will understand that other species may be present in the plasma or gases exiting the showerhead into the reactor. For example, during the low pressure stage, the species entering the deposition chamber from the showerhead typically include $NF_3$ and $NF_x$ as well as atomic fluorine. No ions or electrons are present in significant amounts. At the high pressure stage, $NF_3$ as well as $F_2$ is present.) By appropriately adjusting the pressure, the showerhead acts as a tunable source of the desired atomic and/or molecular fluorine etchant.

Sensors 726 represent gas sensors, pressure sensors etc. that may be used to provide information on reactor conditions during the clean. Examples of chamber sensors that may be monitored during the clean include mass flow controllers, pressure sensors such as manometers, thermocouples located in pedestal, and infra-red detectors to monitor the presence of a gas or gases in the chamber.

As the tungsten is removed from the chamber, tungsten hexafluoride is produced. The tungsten hexafluoride may be sensed by sensors 726, providing an indication of the progress of the clean. The tungsten hexafluoride is removed from the reactor via an outlet (not shown) such that once the clean is complete, the sensor will sense no tungsten hexafluoride. Window 722 may be used to provide visual inspection of the exclusion ring 706. The window may also be located on the top of the reactor. Sensors 726 may also include a pressure sensor to provide chamber pressure readings.

Molecular fluorine may be supplied to the chamber by methods other than using a remote plasma chamber to generate atomic fluorine and regulating the pressure so that the atomic fluorine combines into molecular fluorine as described above. For example, fluorine gas may allowed into the chamber from a fluorine gas supply. However, in embodiments that employ both atomic and molecular fluorine as described above, the use of the remote plasma chamber provides a simple way to switch between stages. Moreover, the remote plasma chamber allows the use of $NF_3$, which is easier to handle than molecular fluorine, as an inlet gas to the system. Certain embodiments may employ a direct (in-situ) plasma for the generation of atomic fluorine, rather than a remote plasma source.

In certain embodiments, a controller 721 is employed to control process conditions during the clean. The controller will typically include one or more memory devices and one or more processors. The processor may include a CPU or computer, analog and/or digital input/output connections, stepper motor controller boards, etc.

In certain embodiments, the controller controls the pressure in the reactor. The controller may also control all of the activities during the cleaning process, including gas and plasma flow. The system controller executes system control software including sets of instructions for controlling the timing, mixture of gases, chamber pressure, chamber temperature, and other parameters of a particular process. Other computer programs stored on memory devices associated with the controller may be employed in some embodiments.

Typically there will be a user interface associated with controller 724. The user interface may include a display screen, graphical software displays of the apparatus and/or process conditions, and user input devices such as pointing devices, keyboards, touch screens, microphones, etc.

The computer program code for controlling the processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing during each stage, chamber pressure during each stage, process gas composition and flow rates, plasma conditions such as RF power levels and RF frequency, cooling gas pressure, and chamber wall temperature. These parameters are provided to the user in the form of a recipe, and may be entered utilizing the user interface.

Signals for monitoring the process may be provided by analog and/or digital input connections of the controller 724. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include process gas control code, pressure control code, and plasma control code.

A chamber pressure profile program may include program code for controlling the chamber pressure during each stage of the cleaning process by regulating, e.g., a throttle valve in the exhaust system of the chamber. A stage timing program may include code for changing pressure based on the amount of tungsten hexafluoride in the chamber and/or user input and/or predetermined timing sequences. A process gas control program may include code for controlling gas composition and flow rates. A plasma control program may include code for setting RF (or other plasma source power) power levels applied to the remote plasma chamber.

Experimental

Tungsten film was cleaned from a reactor using the following two processes:

|  | Stage 1 | | | Stage 2 | | |
| --- | --- | --- | --- | --- | --- | --- |
|  | $NF_3$ flow | Ar flow | Pressure | $NF_3$ flow | Ar flow | Pressure |
| Process 1 | 3.75 slm | 0 | 3 Torr | 4 slm | 0 | 1 Torr |
| Process 2 | 3.75 slm | 1.75 slm | 15 Torr | 4 slm | 0 | 1 Torr |

Over-etch, which is based on the time it takes to clean the ceramic components and the time to completely clean the reactor was calculated.

Over-etch%=100×(Total time−Ceramic time)/(Total Time)

Over-etch for process 2 was <25%, while over-etch for process 1 was approximately 55%. Additional results are shown in FIG. 4 and discussed above.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A multi-stage method of removing film deposited on surfaces in deposition chamber using a remote plasma source, the method comprising: a first stage in which atomic fluorine is introduced to the deposition chamber at a chamber pressure of no more than about 8 Torr and a second stage in which molecular fluorine is introduced to the deposition chamber at a chamber pressure of at least about 8 Torr.

2. The multi-stage method of claim 1 wherein the film is a tungsten-containing film.

3. The method of claim 1, wherein the atomic fluorine is introduced to the deposition chamber at a chamber pressure of no more than about 3 Torr.

4. The method of claim 1 wherein the first stage is performed prior to the second stage.

5. The method of claim 1 wherein the second stage is performed prior to the first stage.

6. The method of claim 5 wherein generating atomic fluorine in a remote plasma source comprises flowing $NF_3$ into the remote plasma source.

7. The method of claim 1 wherein the fluorine to be introduced to the deposition chamber is generated as atomic fluorine in a remote plasma source and introduced to the chamber via a showerhead.

8. The method of claim 7 wherein during the second stage most of the atomic fluorine is recombined at the point of introduction to the chamber or on the showerhead surface.

9. The method of claim 1 further comprising a third stage in which atomic fluorine is introduced to the chamber at a pressure of less than about 5 Torr.

10. The method of claim 1 further comprising a third stage in which atomic fluorine is introduced to the chamber at a pressure of more than about 10 Torr.

11. The method of claim 1 wherein molecular fluorine is introduced to the deposition chamber at a chamber pressure of at least about 15 Torr.

12. The method of claim 1 wherein chamber pressure is of no more than about 5 Torr during the first stage.

13. The method of claim 12 wherein chamber pressure is at least about 10 Torr during the second stage.

14. The method of claim 1 wherein chamber pressure is at least about 10 Torr during the second stage.

15. The method of claim 1, wherein an etch rate during the first stage is higher than an etch rate to during the second stage.

16. A method of removing tungsten deposited on pedestal and ceramic ring surfaces in a deposition chamber, the method comprising:
   introducing a fluorine-containing gas to a plasma source remote to the deposition chamber to generate atomic fluorine;
   flowing atomic and/or molecular fluorine from the remote plasma source to a showerhead to be introduced to the deposition chamber;
   introducing atomic and/or molecular fluorine to the deposition chamber via the showerhead; and
   exposing the pedestal and ceramic ring surfaces to the atomic and/or molecular fluorine such that the atomic and/or molecular fluorine and deposited tungsten react to form tungsten hexafluoride, to thereby remove at least some of the deposited tungsten, wherein introducing atomic and/or molecular fluorine to the deposition chamber via the showerhead comprises a first stage in which chamber pressure is at no more than about 5 Torr such that amount of atomic fluorine introduced to the chamber is greater than the amount of molecular fluorine introduced to the chamber, and a second stage is which the chamber pressure is at least 10 Torr such that the amount of molecular fluorine introduced to chamber is greater than the amount of atomic fluorine introduced to the chamber.

17. The method of claim 16, wherein the chamber pressure during the first stage is at no more than about 3 Torr.

18. The method of claim 16, wherein the first stage is performed prior to the second stage.

19. The method of claim 16, wherein the second stage is performed prior to the first stage.

20. The method of claim 16, wherein the fluorine-containing gas is $NF_3$.

21. The method of claim 16, wherein the chamber pressure at the first stage is about 1 Torr, and the chamber pressure at the second stage is about 15 Torr.

22. A method of removing unwanted film deposited on interior surfaces of a deposition chamber including on ceramic ring and pedestal surfaces of a ceramic ring and pedestal within the deposition chamber, wherein said ceramic ring is located between the pedestal and a showerhead in the deposition chamber; the method comprising:
   introducing molecular fluorine to the deposition chamber via the showerhead;
   exposing the deposited film to molecular fluorine to thereby cause a reaction that removes the film from the interior surfaces of the deposition chamber including the pedestal and ceramic ring surfaces; wherein the chamber pressure is regulated such that a film removal rate from all of the interior surfaces of the deposition chamber is approximately the same as a removal rate from the ceramic ring.

23. The method of claim 22, wherein the film is a tungsten-containing film.

* * * * *